US005585772A

United States Patent [19]
Joshi et al.

[11] Patent Number: 5,585,772
[45] Date of Patent: Dec. 17, 1996

[54] MAGNETOSTRICTIVE SUPERCONDUCTING ACTUATOR

[75] Inventors: Chandrashekhar H. Joshi, Bedford; John P. Voccio, Somerville; Anthony J. Rodenbush, Marlborough, all of Mass.; Carl J. Russo, Loveland, Ohio

[73] Assignee: American Superconductor Corporation, Westborough, Mass.

[21] Appl. No.: 374,382

[22] Filed: Jan. 11, 1995

Related U.S. Application Data

[63] Continuation of Ser. No. 26,564, Mar. 4, 1993, abandoned.
[51] Int. Cl.$^6$ ............................ H01F 7/00; H01F 1/00; H01F 6/00; H01L 41/06
[52] U.S. Cl. ........................ 335/215; 335/216; 310/26; 505/211
[58] Field of Search .................. 335/216, 215; 310/26; 367/140, 156, 168; 62/51.1, 51.2

[56] References Cited

U.S. PATENT DOCUMENTS

| | | | |
|---|---|---|---|
| 3,133,144 | 5/1964 | Cottingham | 335/216 |
| 3,612,924 | 10/1971 | Semmelink | 310/26 |
| 4,365,942 | 12/1982 | Schmidt | 417/412 |
| 4,425,811 | 1/1984 | Chatzipetros | 73/863.11 |
| 4,545,042 | 10/1985 | Fomin | 367/189 |
| 4,718,046 | 1/1988 | Medlin | 367/31 |
| 4,757,219 | 7/1988 | Yamauchi | 310/26 |
| 4,819,451 | 4/1989 | Hingst | 62/514 JT |
| 4,845,450 | 7/1989 | Porzio | 335/215 |
| 4,873,605 | 10/1989 | Drits | 361/143 |
| 4,906,879 | 3/1990 | Clark | 310/26 |
| 5,034,373 | 7/1991 | Smith | 505/1 |
| 5,039,894 | 8/1991 | Teter | 310/26 |
| 5,046,929 | 9/1991 | Novotay | 417/439 |
| 5,093,645 | 3/1992 | Dorri | 335/216 |
| 5,299,425 | 4/1994 | Hingst | 62/51.1 |

FOREIGN PATENT DOCUMENTS

| 4103665 | 8/1992 | Germany | 335/215 |
|---|---|---|---|

OTHER PUBLICATIONS

Spano, "Magnetostriction of TbDy Single Crystals Under Compressive Stress", IEEE Transactions on Mag., vol.26, No. 5, Sep. 1990.
Goodfriend, "Application of a Magnetostrictive Alloy, Terfenol-D to Direct Control of Hydraulic Valves", SAE, Int. Off–Hwy & Powerplant Cong. & Expo, Sep. 10–13, 1990.

*Primary Examiner*—Leo P. Picard
*Assistant Examiner*—Stephen T. Ryan
*Attorney, Agent, or Firm*—Hale and Dorr

[57] ABSTRACT

An actuator in which a magnetostrictor is subjected to magnetic fields produced by a superconducting coil, and the magnetostrictor and coil are maintained at temperatures below the magnetic transition temperature of the magnetostrictor and the superconducting temperature of the coil, typically at temperatures in the range of about 4 to about 130 degrees Kelvin. The magnetostrictor is a laminated Terbium Dysprosium (TbDy) alloy structure and the coil includes high temperature superconducting oxide material. The laminations of the TbDy structure are mechanically loaded in compression and each has a thickness substantially equal less than or equal to the depth of field penetration, and a cooler maintains both the TbDy and superconductor at their optimum temperatures.

17 Claims, 7 Drawing Sheets

$$\delta = \frac{1}{\sqrt{\mu \sigma \omega}}$$

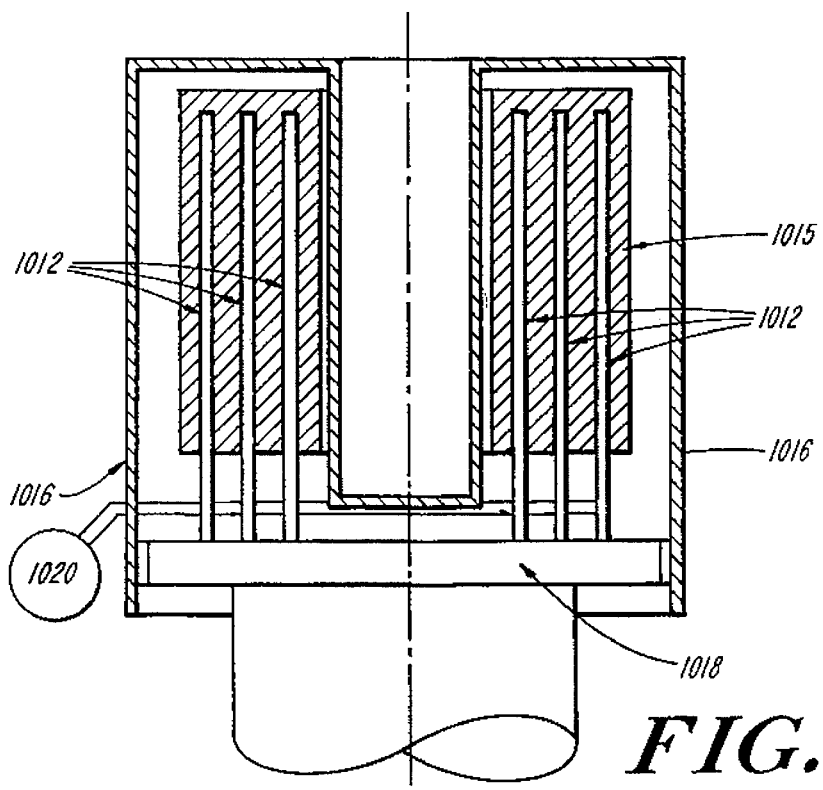
FIG. 10
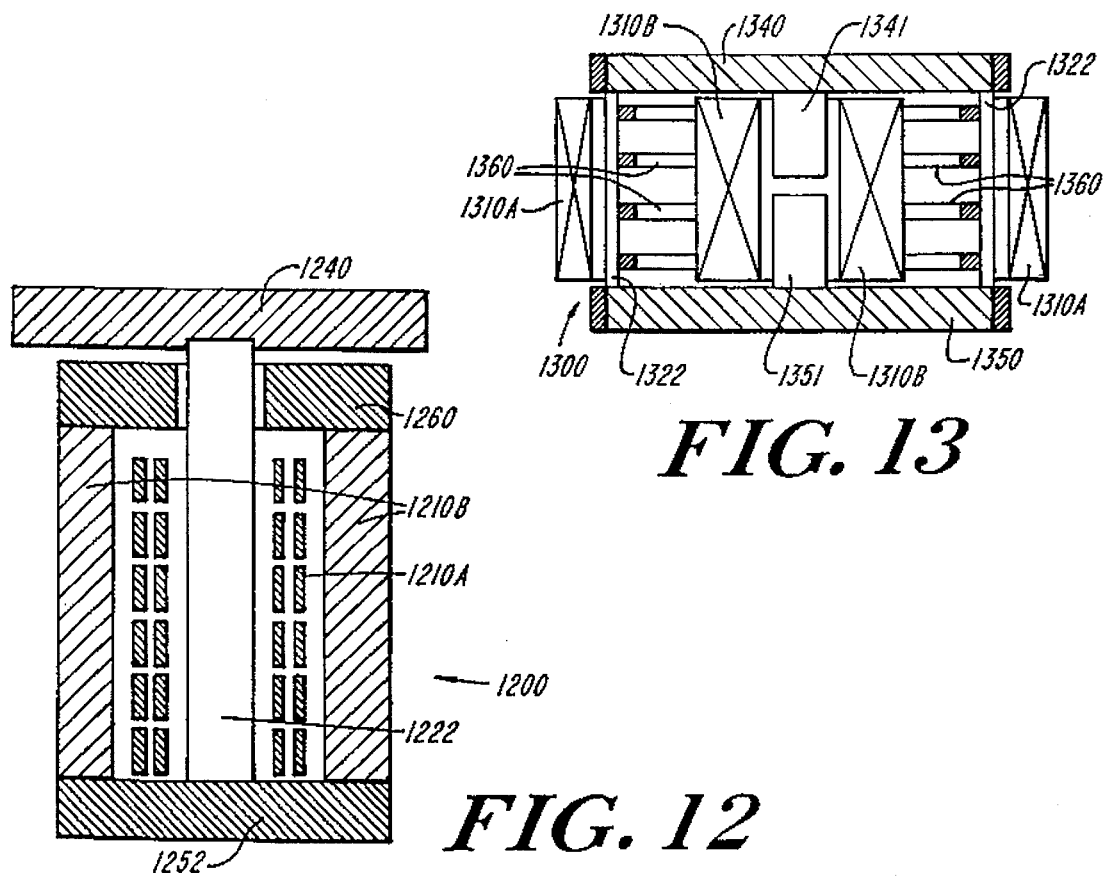
FIG. 13
FIG. 12

MAGNETOSTRICTIVE SUPERCONDUCTING ACTUATOR

GOVERNMENT RIGHTS IN INVENTION

This invention was made with U.S. Government support under contract no. N66604-91-C-D086 awarded by the Naval Underwater Systems Center (NUSC). The Government has certain rights in this invention.

This is a continuation of application Ser. No. 08/026,564 filed on Mar. 4, 1993 now abandoned.

FIELD OF THE INVENTION

This invention relates to actuators and, more particularly, to actuators in which a magnetostrictive element is subject to fields produced by a superconducting coil.

BACKGROUND OF THE INVENTION

There are a number of existing devices which are intended to convert electrical energy into mechanical displacement. Typically useful in applications where relatively small displacements are required, electrical-to-mechanical actuators can, for example, be used to position components, provide to vibratory motion, and otherwise to convert electrical power into mechanical or acoustic power.

One presently used positioning device is the electromagnetic solenoid. These use a wire-wound coil to cause movement of a ferromagnetic plunger. Typically, solenoids are able to exert force in only one direction. Motion in the one direction can be applied over a relatively long stroke, but a spring or the like is required to move the plunger back to the starting position. Solenoid devices are thus limited to slow motion, and oscillatory motion is limited. Further, they are of relatively low efficiency since electrical energy is dissipated in the coil when the current is flowing, regardless of whether there is any movement of the plunger.

Currently, both electromagnetic coil and piezoelectric devices are used to convert electrical energy into oscillatory motion, and are used for making high efficiency loud speakers and microphones. However, they are limited to high frequency operation (typically greater than 1 kHz) and cannot be used to apply a static force. Magnetic coils are used in lower frequency loud speaker systems, but the loud speakers are typically very inefficient.

A third type of electrical-to-mechanical actuator uses a magnetostrictive material in combination with a magnetic coil and/or a permanent magnetic. See M. L. Spano, A. E. Clark and M. Wun-Fogle, Naval Surface Warfare Center, "Magnetostriction of TbDy Single Crystals Under Compressive Stress," IEEE Transactions on Magnetics, pp. 1751–3, Vol. 26, No. 5, 1989; and M. Goodfriend and C. Jones, "Application of a Magnetostrictive Alloy, Terfenol-D, to Direct Control of Hydraulic Valves," Paper no. 901581 presented at the SAE International Off-Highway & Powerplant Congress & Exhibition, Milwaukee, Wis., Sep. 10–13, 1990. A magnetostrictive material will change its dimensions when subjected to a magnetic field, but the strain is typically quite small. A typical such material is an alloy of Terbium (Tb), Dysprosium (Dy) and Iron (Fe) known as "Terfenol." TbDyFe has a maximum strain at room temperature of about 0.25% depending on the exact composition of the alloy; but because it is a brittle intermetallic, it is unable to withstand very high stresses. Relatively large and heavy (e.g., 4 in.×4 in.) coils are normally needed to produce the high magnetic fields required by TbDyFe actuators; and such devices also suffer from several other disadvantages—dissipation of power in the coil due to the wire resistance and the need for a bias field, a maximum efficiency of about 60%, and the need for considerable active cooling.

SUMMARY OF THE INVENTION

The present invention provides a magnetostrictive actuator that matches or exceeds the advantages of prior devices, and at the same time eliminates most of their disadvantages. In particular, the magnetostrictive device of the present invention provides about twice the displacement (about 0.6%), operates efficiently at low frequency (less than 1 kHz), provides very high stresses (e.g., tens to hundreds of kpsi) over a broad frequency range, is not limited to running at its resonant frequency, and can be held in a displaced position with very little power dissipation.

In one aspect, the present invention features an actuator in which the magnetostrictor is subjected to magnetic fields produced by a superconducting coil, and the magnetostrictor and coil are maintained at temperatures below the magnetic transition temperature of the magnetostrictor and the superconducting critical temperature of the coil, typically at temperatures in the range of about 4 to about 130 degrees Kelvin. Other aspects feature a laminated magneto-strictor, preferably of Terbium Dysprosium (TbDy), having a magnetic transition temperature not more than about 150 degrees Kelvin; an HTSC superconducting coil in which heat conductors of high thermal conductivity are interposed between adjacent wire turns and extend to an end of the coil for conducting heat from the coil; an HTSC coil wrapped around a polymeric mandrel whose thermal expansion characteristics are matched to those of the coil; a magnetostrictor and coil within an enclosure containing a gas that will remain in its vapor state at temperatures below 90° K.; and a magnetostrictor to which both an alternating magnetic field and a constant magnetic field are applied, at least the alternating field being produced by an HTSC wire coil. In preferred embodiments, including all of these aspects, the TbDy magnetostrictor is mechanically loaded in compression, each lamination has a thickness less than or equal to the depth of field penetration, and a cryocooler maintains both the TbDy and superconductor at their optimum temperatures.

DESCRIPTION OF THE DRAWINGS

FIGS. 9 and 10 illustrate a cryogenic cooling system useful in the practice of the present invention.

FIGS. 11 through 13 illustrate other configurations of magnetostrictor actuators constructed in accord with the present invention.

DESCRIPTION OF THE PREFERRED EMBODIMENTS

Figure 1:
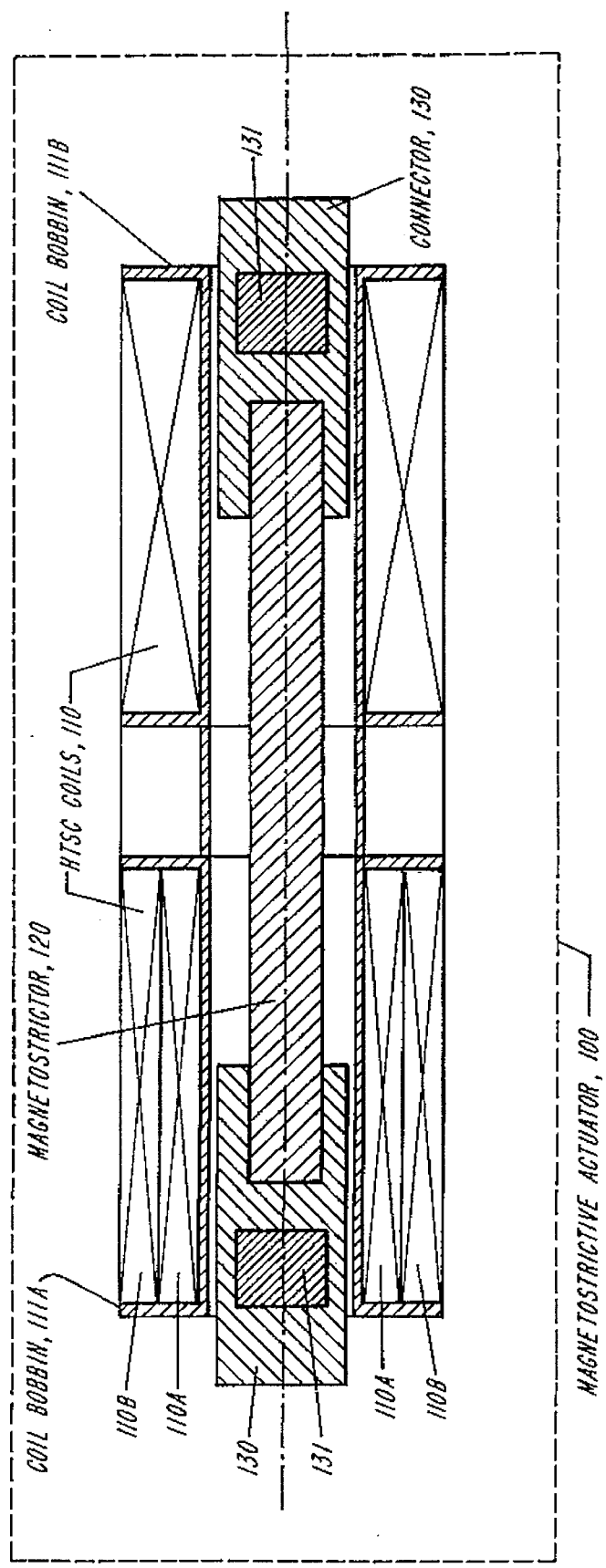
FIG. 1 is a cross-sectional, somewhat schematic, view of an actuator embodying the present invention.

Referring now to FIG. 1 there is shown an actuator, generally designated 100, comprising one or more high-temperature superconducting (HTSC) coils 110, one or more TbDy magnetostrictive rods 120 (one is shown) and two or more connectors 130 (two are shown). Although two coils 110 are shown, a single longer coil that extends axially about the same distance as the pair of coils may also be used. The two HTSC coils 110 surround the magnetostrictive TbDy rod 120 so that the rod is exposed to the magnetic field provided by the coils, and are axially-spaced to improve the uniformity of magnetic field in the rod. A connector 130 is provided at each end of the rod 120 for protecting the rod ends and transmitting the motion of the magnetostrictive rod.

The thermal and other characteristics of various components of the actuator are important. The HTSC coils 110 are comprised of superconducting wire which can be free standing or, as shown, wrapped around a bobbin 111. The bobbin 111 is selected to have a low electrical conductivity to reduce eddy current heating and also to have thermal expansion characteristics that effectively match those of the HTSC coil winding so as not to degrade the electrical performance of the wire upon repeated thermal cycling; typically, the bobbin is a reinforced, non-metallic, organic plastic such as nylon reinforced with fibers or a particulate filler. The wire is chosen to have the desired superconducting properties at the operating temperature of actuator 100. There are several different superconducting materials that can be used. Some of the more commonly used materials are listed below in Table 1 with their respective critical temperatures, e.g., the temperatures at which the materials become superconducting. High temperature superconductors, such as the copper-containing materials listed in Table 1, are usually employed.

TABLE 1

Superconducting Materials and Their Approximate Transition Temperatures In Zero External Magnetic Field

| Material | Critical Temperature (K.) |
|---|---|
| NbTi | 9.2 |
| $Nb_3Sn$ | 18.1 |
| BiSrCaCuO | 85 |
| YBaCuO | 92 |
| PbBiSrCaCuO | 105 |
| TlBaSrCuO | 125–130 |

The HTSC coil 110 may be made in at least two different configurations. In one configuration, illustrated by the coil wound on bobbin 111A, the coil consists of two electrically separate windings, designated 110A, 110B, one wound on top of the other. In this configuration the outer winding 110B is arranged for connection to a suitable source of DC power to provide a steady DC bias field, e.g., 500 Gauss, while the inner winding 110A is arranged for connection to an AC source and provides a field amplitude varying from zero to, e.g., approximately ±500 Gauss. This arrangement will result in a total field that may oscillate from 0 to 1000 Gauss, typically at a frequency of 200–1000 Hz.

In the other configuration, illustrated by the coil wound on bobbin 111B in FIG. 1, the coil 110 consists of only one winding, and the supply current consists of an AC current superimposed onto a DC current.

In either construction, the DC current is typically maintained at a constant level, and the AC current is varied to provide an oscillating net field. The relative sizes of the constant DC, and the varying AC fields are controlled so that the net field will always be in the same direction; i.e., the negative AC field may approach, but will not exceed in magnitude, the positive DC field. In preferred embodiments, the single winding coil construction is preferred; and in practice both coils used in each of the actuators shown herein are single winding coils such as that wound on bobbin 111B.

Preferably, the magnetostrictive material of the magnetostrictor rod 120 has a high thermal conductivity so that the temperature gradients within the magnetostrictive rod are kept at a low level, a low electrical conductivity to reduce eddy current heating in the rod, and a relative permeability greater than that of air to enhance the magnetic flux in the material. In addition, the magnetostrictor preferably is fabricated from thin laminations to reduce eddy current heating and further to improve the performance of the material. In a laminated device such as that shown, the thickness of each lamination is less than the skin depth of the AC fields at the design frequency so that the displacement of the material will be uniform throughout the thickness. In current embodiments, the preferred magnetostrictive material is Terbium-Dysprosium (TbDy), which has a magnetic transition temperature of about 150° K. In other applications, Terbium-Dysprosium-Iron (TbDyFe), or some other now-known or later developed magneto-strictive material having a magnetic transition temperature no lower than the superconducting critical temperature of the HTSC material used in the magnetic coils, may also be desirable.

The connectors 130 provide for the motion of the magnetostrictive rod to be transmitted to outside the actuator. They typically are made of a relatively stiff material, having a high modulus of elasticity, so that a maximum percent of the magnetically-induced expansion of the magnetostrictive rod 120 is transmitted. Connectors 130 also have a low thermal conductivity to minimize the amount of heat flow to the TbDy rod, and relatively low electrical conductivity to reduce eddy current heating when employed. Preferred material include glass-epoxy composites such as that sold by Spaulding Fiber under the trade name G-10; other materials, including alumina, and other sintered ceramics may also be employed.

In some embodiments, an insert of high permeability magnetic material 131 is embedded within each connector 130 to improve field uniformity within the magnetostrictive rod 120, or a high permeability magnetic material may surround the coils. As with the coils 110A, the inserts 131 shown in FIG. 1 are illustrative only; and such inserts are in practice not used in the preferred embodiments.

The actuator 100 can be cooled in several ways, including immersion in a liquid cryogen, conductive connection to a cryocooler, or using heat pipes. The use of superconducting materials requires the coils to be cooled below the superconducting critical temperature of the material; and the use of a magnetostrictive material such as TbDy also requires that the magnetostrictor be cooled to a temperature at which it is magnetic, i.e., to below its magnetic transition temperature.

There are a number of cryogenic liquids that can be used for immersion cooling. Some of these cryogenic liquids are listed below in Table 2 with their respective boiling points.

TABLE 2

Liquid Cryogens and Their Boiling Point Temperatures At Atmospheric Pressure

| Material | Boiling Point Temperature (K.) |
|---|---|
| Helium | 4.2 |
| Hydrogen | 20.3 |
| Neon | 27.0 |

TABLE 2-continued

Liquid Cryogens and Their Boiling Point Temperatures
At Atmospheric Pressure

| Material | Boiling Point Temperature (K.) |
|---|---|
| Nitrogen | 77.1 |
| Argon | 87.4 |
| Oxygen | 90.1 |
| Methane | 111.7 |

It is also possible to use selected mixtures of the liquid cryogens listed above in Table 2. Using immersion cooling, the actuator 100 is placed in a cryogenic dewar containing a cryogenic liquid, such as those listed. Liquid nitrogen is often employed because it is readily available and has a boiling temperature (77° K.) that is below the critical temperature of many HTSC materials and the magnetic transition temperature of TbDy.

A second method of cooling involves the use of a cryogenic refrigerator, or cryocooler, that removes heat from a coldhead and causes the coldhead to reach cryogenic temperatures. The object to be cooled is thermally-connected to the coldhead, and vacuum insulation is provided to minimize the amount of heat flow to the coldhead from the surrounding atmosphere. Available cyrocoolers are capable of maintaining temperatuers as low as about 10° K.

An actuator may also be thermally connected to a cryocooler using an enclosure which envelopes the actuator. The enclosure is made vacuum-tight and, typically, is filled with a gas, e.g., helium, neon, hydrogen, or nitrogen, which remains in its gaseous state at low temperatures. The enclosure and strapping should have high thermal conductivity and sufficient cross-sectional area so that they will efficiently conduct heat away from and conductively cool the HTSC coils 110 and magnetostrictive rod 120. Enveloping a low temperature enclosure with a second vacuum enclosure will further increase efficiency by reducing convection heating from the atmosphere to the enclosure.

Figure 2:
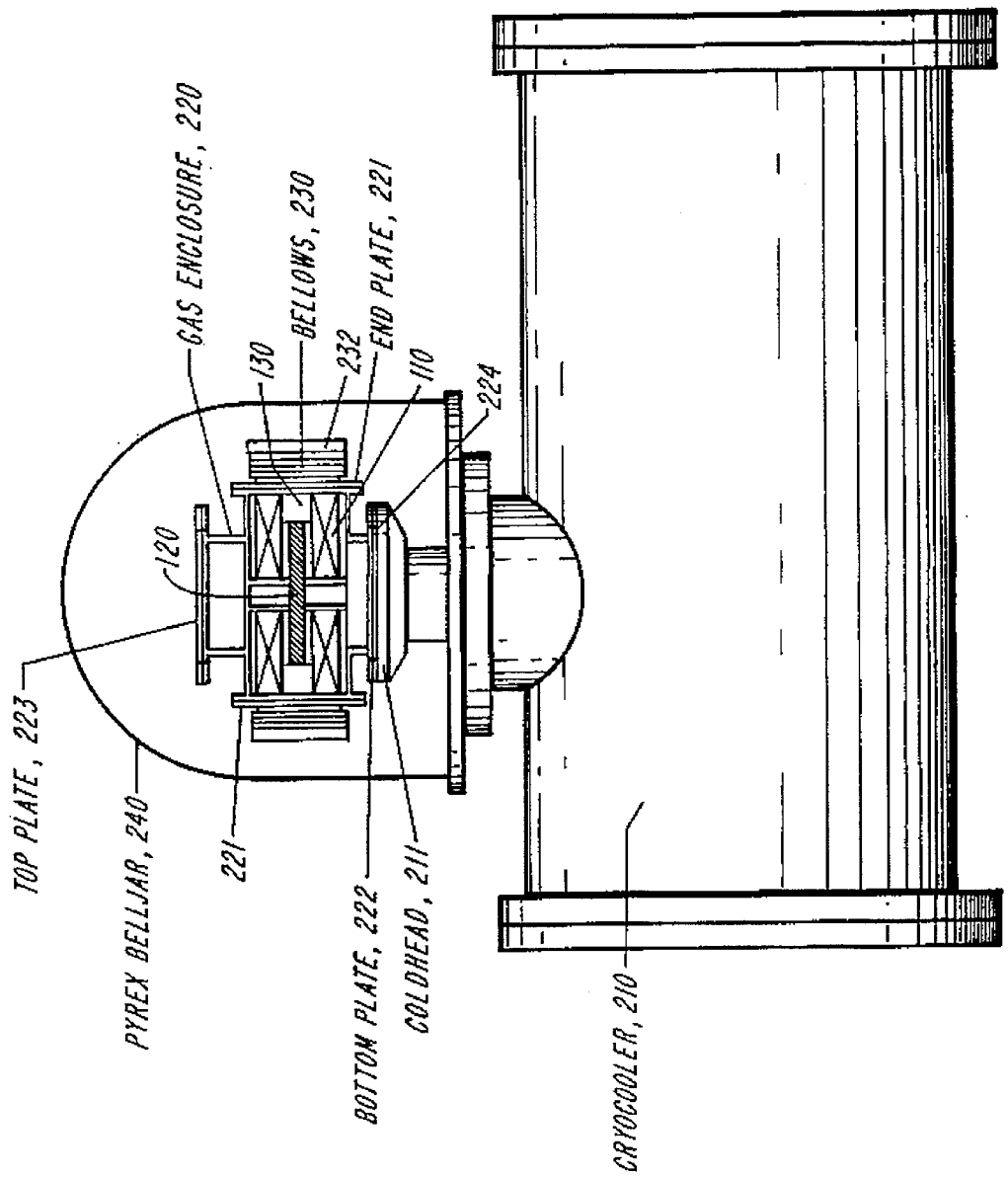
FIG. 2 is a cross-sectional view of the actuator of FIG. 1 in a gas enclosure and connected to a cryocooler.
Figures 3A, 3B:
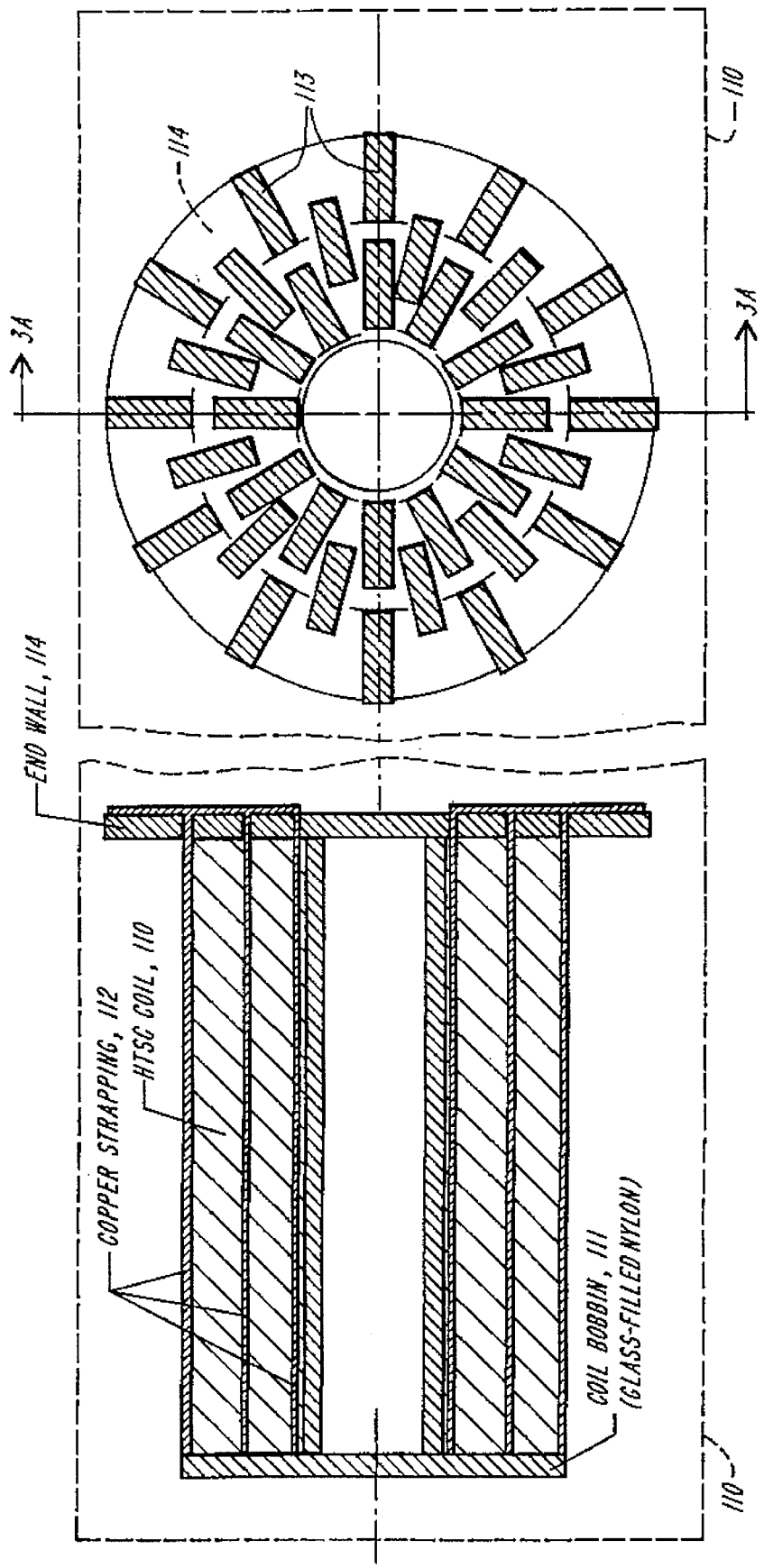
FIGS. 3A and 3B illustrate high temperature superconducting wire coils useful in the practice of the present invention.
Figure 4:
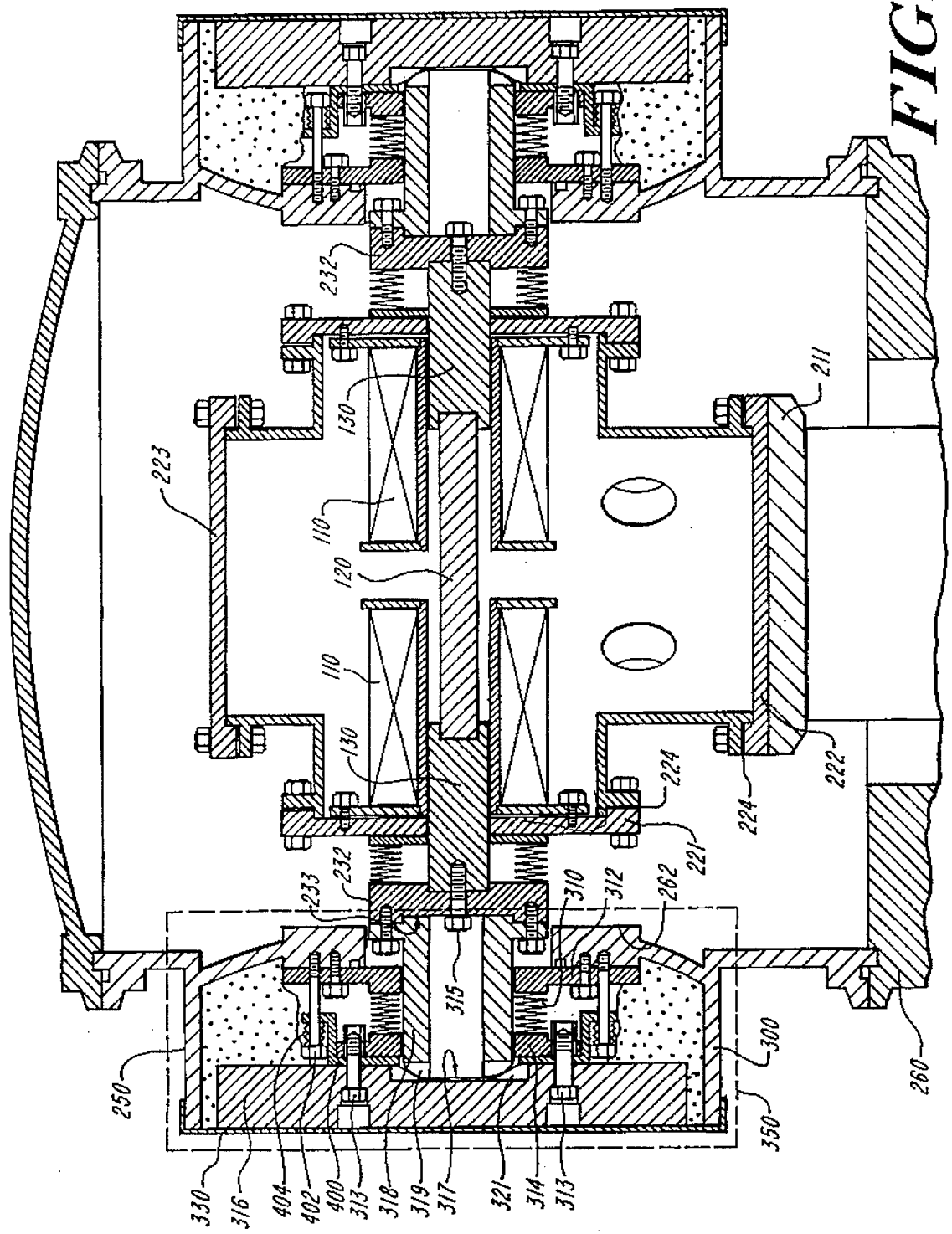
FIG. 4 illustrates the actuator of FIG. 1 in an underwater sonar device.

Reference is now made to FIGS. 2–4 which illustrate an actuator 100 connected to a cryocooler 210, which is the preferred method of cooling. As discussed above, actuator 100, includes a pair of superconducting coils 110, which in turn coaxially surround an axially-extending magnetostrictive rod 120, and two connectors 130. As shown most clearly in FIGS. 3A and 3B, each coil 110 includes a large number (i.e., sufficient to produce the desired field, in the preferred embodiment about 300) of turns of multi-filamentary HTSC wire wound around a bobbin or mandrel 111. To assist in cooling the HTSC wire windings, a number (36 are shown in FIG. 3B) of thermally conductive straps 112 extend axially from and are embedded in the windings of coil 110. In the illustrated embodiment, straps 112 are braided copper wire; other materials, such as aluminum, may also be used. As shown, the copper straps 112 are arranged in three radially-spaced sets, each including twelve circumferentially spaced straps 112. The ends 113 of each strap 112 extend through slots in the outer axial end wall 114 of each bobbin 112 and bend to lie flat against the outside of the end wall 114. The strap ends, in turn, are thermally connected to the coldhead 211, e.g., through an abutting thermally-conductive plate 221 and the walls of the gas enclosure 220, which in turn provide for heat flow to the coldhead 211 from the coils 110 and magnetostrictor 120. The multi-filamentary HTSC wire is, for example, about 100 mils wide and 8 mils thick, and is comprised of many Bismuth-Strontium-Calcium-Copper Oxide superconducting filaments surrounded by a silver (Ag) sheath and an insulating outer coating.

The cryocooler coldhead 211 is connected to the gas enclosure bottom plate 222, while the gas enclosure top plate 223 allows access to the inside of the gas enclosure 220. The gas enclosure 220 is generally cylindrical, and its axis is generally concentric with the axes of the coils 110, magnetostrictive rod 120 and connectors 130. Seals 224 are placed between the gas enclosure main body and the four plates—top plate 223, bottom plate 222 and two side plates 221—to make the enclosed vacuum-tight; and the enclosure 220 is filled with a cooling gas (e.g., helium, neon, hydrogen or nitrogen).

As shown, each connector extends coaxially through the bore in the respective end plate 221, and is surrounded by a metal bellows 230. One end of the bellows 230 is welded to a stainless steel fitting 231 which is in turn brazed to endplate 221. The other end of the bellows is welded to endplate 232 which in turn is rigidly attached to connector 130. The bellows 230 and the plates to which it is connected seal each end of enclosure 220, while still allowing the motion of the magnetostrictor 120 to be transmitted unrestricted to the actuator via the connectors 130.

In the FIG. 2 configuration, the vacuum environment necessary to provide thermal insulation between the magnetostrictive actuator and the outside atmosphere is provided by a Pyrex belljar 240. In the embodiment of FIG. 4, which is designed for use as a driver for an underwater sonar device, the vacuum environment which surrounds the gas enclosure is provided by a second enclosure, a vacuum/acoustic enclosure generally designated 250. As shown, enclosure 250 includes a baseplate 260 adapted for connection to the cryocooler 220 (not shown in FIG. 4), and a pair of vacuum enclosure end plates 262 each of which includes a bore coaxially aligned with the magnetostrictive rod 120 and connectors 130.

An expansible driver section 350 (denoted by the dotted line in FIG. 4) is provided at each end of housing 250 to transmit the motion of the magnetostrictive rod 120 from end plates 232 to the output piston head mass 316. As shown, each expansible section includes an expansible bellows 310 extending coaxially between the bellows end plate 312 and a piston drive plate 314. A piston head mass 16 is in turn attached to each piston drive plate 314. A hollow cylindrical driver 318 has its inner end fitted in a cylindrical recess 233 in the outer surface of end plate 232, and extends through axial bores in plates 312 and 314 to a cylindrical recess 317 in the inner surface of piston head 316. The outer end 319 of the driver 318 engages but is not fixed to, a mating insert 321, which is fitted in each recess 317, thereby minimizing transmission of any bending moments that might otherwise cause fracture of the magnetostrictive rod. A bolt 315 connects plate 232 to the respective connectors 130. Thus, and as will be seen, magnetically induced strain in the magnetostrictive rod 120 will cause axial movement of drivers 318 and, hence, of piston head mass 316.

A flexible rubber diaphragm 330 covers the outer surface of each piston head mass 316 and fits closely around the cylindrical sides of the adjacent portions of the cylindrical housing 300. The enclosed volume of each driver section 350 is filled with a closed-cell foam, e.g., a neoprene rubber, that absorbs some or all of the sound being transmitted backwards into the interior of the transducer; the sound, if allowed to reflect outward, would cancel some of the outwardly radiated energy and thus diminish the effective radiated power and the device's efficiency. As will be evident from the drawings, the interior of expansion housing section 350 is sealed from that of enclosure 250, which is typically under vacuum. In sonar operations, the interior volume of expansion section 350 may be flooded with water so that substantially equal pressure on opposite sides of the piston head masses 316 prevents excessive force from being applied to the coil/magnetostrictor assembly.

In all of the illustrated embodiments, it is important that the magnetostrictive rod 120 always be maintained under a compressive load. The necessary compressive preload may be provided in a number of ways. In the system of FIG. 4, the precompression is provided by applying an axially-inward bias force to each of the piston head masses 316. As shown, a load-applying plate 400 is sandwiched between the inner surface of each piston head mass 316 and the adjacent outer surface of the piston drive plate 314, and the compressive load ranges from about 1000 to 5000 psi in the magnetostrictor. A plurality of circumferentially spaced bolts 402 connect plates 400 and 312 and draw them axially towards each other. The bolts 402 are surrounded with Bellville washers 404, so that the extent to which the bolts 402 are tightened may be varied as required to provide the desired spring-like bias load.

In the typical operation of actuator 100, sources of power (not shown) are connected to the AC and DC portions of the superconducting coils 110. Typically a DC controller controls the magnitude of the current applied to the DC portion of the coil, and thus the magnitude of the constant field applied by the DC portion of the superconducting magnetic coils 110. The constant, DC induced, field causes a predetermined positive strain of the magnetostrictor(s), the amount of strain depending on the magnitude of the DC field. Reciprocating movement of the piston head 316 to produce for example, a sound output is provided by applying AC current to the coils in addition to the DC field. An AC controller controls the magnitude (i.e., peak-to-peak amplitude), frequency and, in some embodiments, shape (e.g., sinusoidal or non-sinusoidal) of the AC current applied to the AC portion of the coils 110. The AC current produces a variable, typically sinusoidal, field which adds to (or subtracts from) the DC-induced constant bias field and causes corresponding increases and decreases in the magnetically-induced strain of the magnetostrictors. As will be recognized, the frequency, magnitude and shape of the alternating magnetic field depend on the frequency, magnitude and shape of the AC current applied to coils 110. As earlier indicated, the magnitudes of the constant (DC-induced) and variable (AC-induced) fields are selected so that the net field will always be in the same direction and cause varying, but always positive, magnetostrictor strain. The frequency of oscillation of the piston heads 316 may be changed by changing the frequency of the AC current. In the illustrated embodiment the frequency is typically in the range of about 200 to about 1000 Hz. In other embodiments the AC frequency may be reduced to zero to effectively apply only a DC-induced field.

Figure 5:
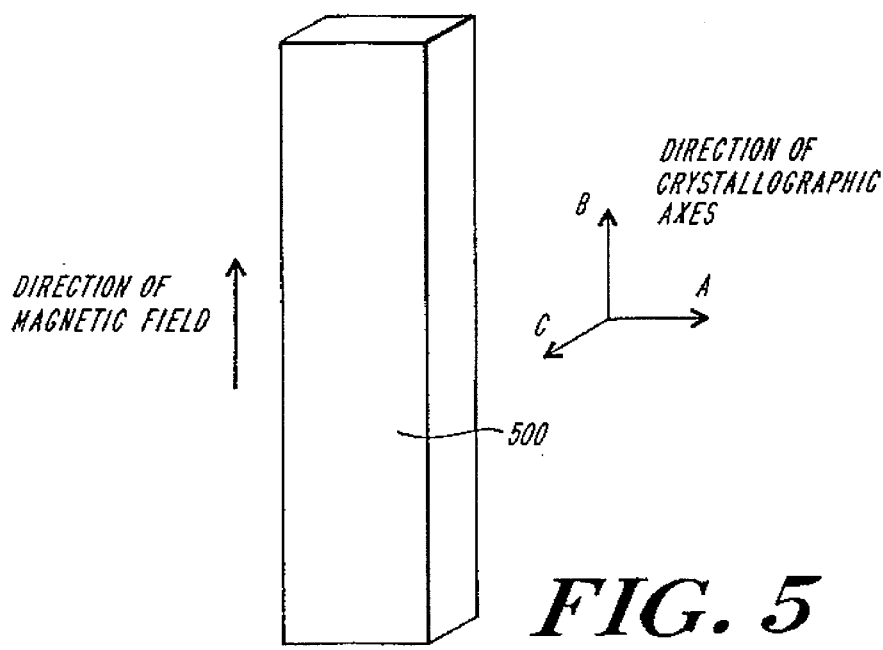
FIGS. 5 and 6 illustrate magnetostrictive elements useful in the practice of the invention.
Figure 6:
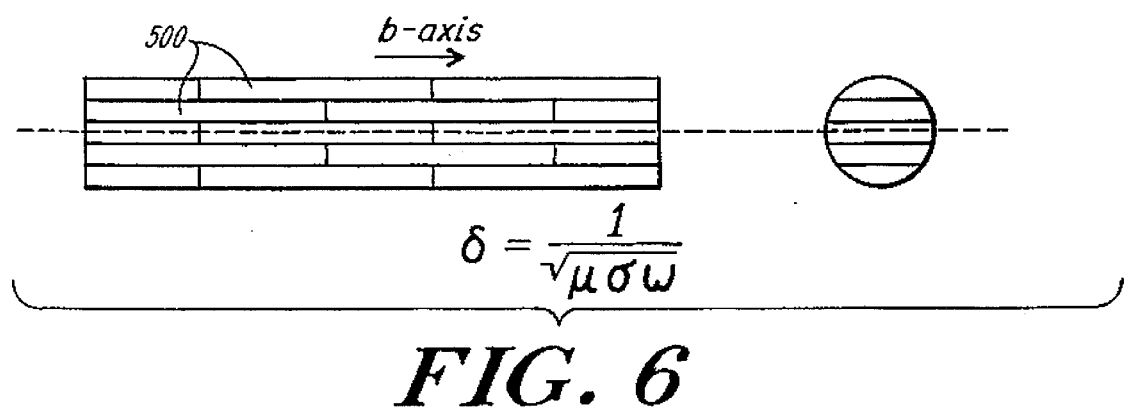

Reference is now made to FIGS. 5 and 6 which illustrate the construction of magnetostrictive rod 120 and its orientation within a magnetic field. As shown, the rod 120 is a brick-like laminated structure of generally rectangular single crystal pieces 500 of magnetostrictive material. In the preferred embodiment, the magnetostrictive rod is 6 inches long, with a square cross-section that is 0.6 in. long on each side, and is comprised of fifteen pieces of TbDy material, each 0.040 inches thick, held together with an electrically non-conductive epoxy. A maximum strain magnetically induced in the rod is about 0.67, resulting in displacement of the rod of about 18 mils of each rod end (i.e., 36 mils overall displacement).

The TbDy magnetostrictive material is conventionally grown in a single crystal configuration, crystallized in disc shape; and the magnetic field is normally aligned with the hexagonal b-axis of the crystal structure. Alternatively the TbDy material may be produced by zone refining or other conventional techniques such as those used to grow silicon for the semiconductor industry. When grown in disc form, the b-axis with which the magnetic field is normally aligned is in the plane of the disc; when grown in rod form, the b-axis of alignment for the magnetic field is perpendicular to the axis of the rod being grown. In a laminated rod, no matter what technique is employed, rectangular bricks 500 are cut from a TbDy disc, and are oriented so that the hexagonal b-axis is along the long axis of the brick while the a- and c-axes are each perpendicular to a side face, as shown in FIG. 5. FIG. 5 shows the relationship between the axes of the crystallographic structure of the TbDy and the direction of the magnetic field.

The length and width of the bricks 500 depends on the dimensions of the rod or disc from which they are cut. The thickness (which may be in either the "a" or "c" crystallographic axis) is determined on the basis of the frequency at which the magnetostrictive device is designed to operate. The thickness of the laminate should be equal to or less than the depth of field penetration, so the higher the design frequency, the thinner the desired thickness of the laminated layers from which the magnetostrictor rod is constructed. Generally, the maximum thickness, δ, is determined on the basis of the following formula:

$$\delta = 1/(\mu\sigma\omega)^{1/2}$$

in which μ is the magnetic permeability of the material, σ is the electrical conductivity, and ω is the design frequency.

Figure 7:
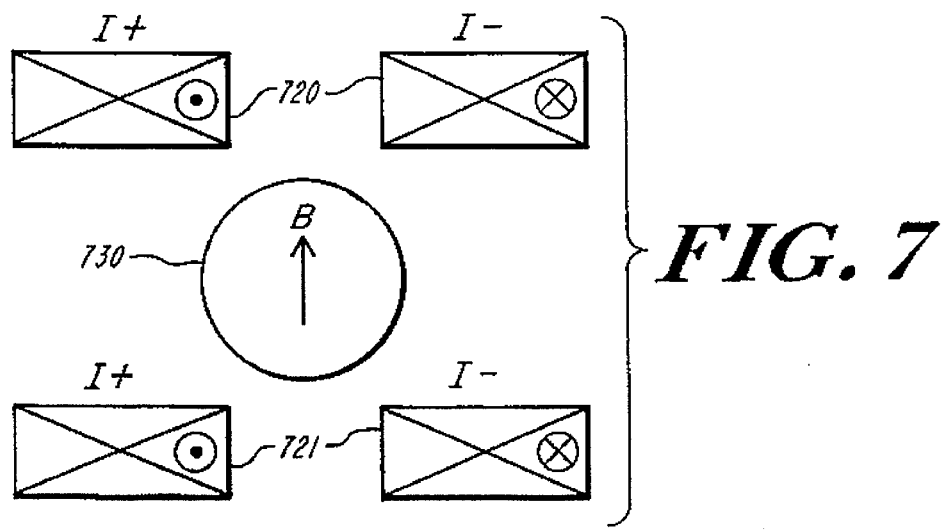
FIGS. 7 and 8 illustrate, schematically, other embodiments of the invention.

FIG. 7 is a cross-sectional view of, and schematically illustrates, a coil/magnetostrictor driver structure which utilizes a rod of TbDy magnetostrictive material in essentially its "as grown" configuration, and without the need for cutting, grinding, laminating, etc. As shown, the device includes a pair of elongated, oblong (e.g., so-called "racetrack") coils 720, 721, one above and the other below a rod 730 of magnetostrictive material. The directions of current (I) flow in coils 720, 721, and the resulting magnetic field (B), are in the directions indicated. While the induced strain in the rod 730 is along the direction of the field B, the interaction of directional material properties causes strain along the rod axis and the resulting motion can be used to produce sound or perform other work.

The coil/magnetostrictor arrangement shown in FIG. 7 permits either or both of the coils 720, 721 and the rod 730 to be rotated about the longitudinal central axis of the rod 730. Relative rotation of the coils and rod causes the magnetic field alternately to align with directions parallel and perpendicular to the preferred crystal orientation in the rod. Thus, continuous relative rotation of the coils and rod causes strain oscillation, and the extent of strain can be directly coupled to the rotational position of the coils relative to the magnetostrictor rod.

Figure 8:
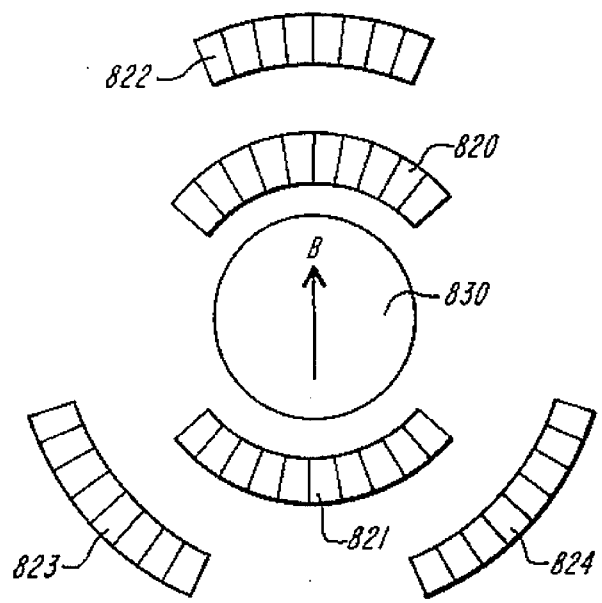

FIG. 8 is a cross-sectional view of, and schematically illustrates, a coil/magnetostrictor arrangement which includes both an inner set of coils 820, 821, and an outer set of coils 822, 823, 824, surrounding a rod 830 of magnetostrictive material. As in FIG. 7, the cross-section is taken perpendicular to the long axis of the rod and coils.

In the FIG. 8 arrangement, all of the coils are "saddle coils," i.e., the ends of the coils generally follow an arc centered on the rod axis so that the distance from the rod to the long sides of the coils is less than if, as in FIG. 7, the ends were straight. The inner coils 820, 821, which typically are fixed relative to each other, are energized with DC current through a set of conventional slip rings (not shown) so that the entire inner coil structure can rotate about the central axis of the device. Magnetostrictive rod 830, which extends coaxially along the device, is fixed, as are the three outer coils 822, 823, 824. Rotation of the inner coils is caused by three-phase current introduced into the three outer coils. In the illustrated embodiment, three phase current is used to power a set of three coils; in other embodiments, the number of coils in the outer coil set and the number of phases of the current may be varied.

The magnetic field produced by the three-phase current in the outer set of three coils 822, 823, 824 interacts with the inner set of coils 820, 821, causing the inner coils to rotate at a frequency which depends on the frequency of excitation of the outer coils and on the number of coils in the inner set. The rotation of the inner coil set, in turn, causes the magnetic field imposed on the magnetostrictive rod 830 to rotate, causing the magnetostrictor to strain in tandem with the rotational speed of the field.

As will be evident, the complete coil/magnetostrictor devices schematically illustrated in FIGS. 7 and 8 will typically be enclosed within cryogenically cooled enclosures of the types previously discussed, and the output from the devices will be taken from outputs coupled to the ends of the magnetostrictor rods 730, 830.

Figure 9:
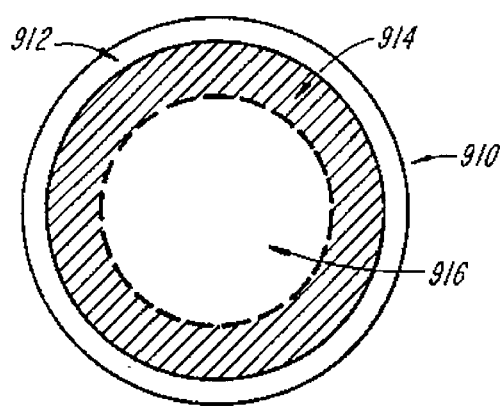

The cryocooler used with the previously described embodiments cools largely by conduction, and also by convection of the cooling gas through the interior of the enclosure. Conduction is assisted by the copper straps 112 previously described. An alternative structure for enchancing heat conduction is shown in FIGS. 9 and 10. FIG. 9 is a cross sectional view of a small diameter heat pipe 910 consisting of a cylindrical tube 912 with sealed ends made from a high strength material such as stainless steel or high strength copper or aluminum alloys. This heat pipe 910 is filled with a cryogenic gas selected based upon the desired operating temperatures. The range of operating temperatures associated with any cryogenic gas is greater than its triple point temperature and less than its critical temperature. For example, neon has a triple point temperature of 25° K. and a critical temperature of 44.4° K. Therefore, a heat pipe using neon can be operated within the range of temperature between 25° K. and 44.4° K. Triple point and critical temperatures for selected cryogenic gases are listed in Table 3.

TABLE 3

Triple Point and Critical Temperatures for Selected Cryogenic Gases

| Cryogenic Gas | Triple Point Temperature (K.) | Critical Temperature (K.) |
| --- | --- | --- |
| Hydrogen | 13.95 | 33.18 |
| Neon | 25.0 | 44.4 |
| Nitrogen | 63.2 | 126.3 |
| Argon | 83.8 | 150.7 |
| Oxygen | 54.4 | 154.8 |
| Methane | 88.6 | 190.7 |

The quantity of cryogenic gas in the heat pipe is selected such that given the total internal volume of the heat pipe, approximately 5–25% of the cryogenic gas will be condensed and in liquid form at the desired operating temperature.

The inner wall of the tube 912 is lined with a porous wick material 914. The wick material 914 is a porous woven mesh made of fine wires of a material which is wetted by the selected operating fluid in the liquid state. For the neon heat pipe of the above example, the wick is a woven fine copper or stainless steel mesh.

In the embodiment shown in FIG. 9, the heat pipe 910 is made from stainless steel and has an inside diameter of 0.125" and outside diameter of 0.25". The wall thickness of the heat pipe tube 912 is determined from standard pressure vessel calculations for the pressure associated with the desired operating temperature. The length can be from 1" to several feet long and the heat pipe 910 need not necessarily be straight. The wick material 914 is approximately 0.06" thick and is comprised of a stainless steel woven mesh made with fine wire (less than 0.005" diameter). Other wick materials include but are not limited to fibrous cloth, sintered powdered metals and porous ceramics.

In the arrangement of FIG. 10, a number of heat pipes 1012 extend between the windings of a superconducting coil 1015. As shown, the coil is mounted within a vacuum enclosure 1016, and the coldhead 1018 of the cryogenic cooler (e.g. a cryocooler or a liquid cryogen container having a coldhead similar to that of coldhead 211 shown in FIGS. 2 and 4) closes one end of the enclosure 1016. A gas reservoir 1020 is connected to each heat pipe 1012. For clarity, the reservoir 1020 is shown outside the vacuum enclosure 1016 and spaced from the coldhead 1018. In practice, it is typically close to the heat pipes 1020, often within enclosure 1016, and is positioned so that it and any working fluid in it are cooled by the cryogenic cooler. The purpose of the reservoir 1020 is to provide additional volume for the working fluid vapor when, as at room temperature, substantially all of the fluid is in the vapor rather than the liquid state, and thus to reduce the resulting pressure in the system to well below what it would be in the absence of the reservoir.

As shown, one end of the each of the heat pipes 1020 is in intimate thermal contact with the coldhead 1018 of the cooler and the other end is in intimate thermal contact with the superconducting coil 1015. In operation, the cryocooler causes liquid at the cold end of the heat pipe to condense. The liquid wets the wick material 914 (shown in FIG. 9), and capillary action causes the liquid to flow through the wick towards the other end of the heat pipe. At the end in contact with the coil 1015, the liquid absorbs heat and vaporizes. The vapor fills the central cavity 916 of the heat pipe, and is transported back to the cooling end carrying the absorbed heat with it. There, the absorbed heat is conducted to the cryocooler coldhead, reliquifying the gas.

Reference is now made to FIGS. 11 through 14 which illustrate other magnetostrictor actuators constructed in accord with the present invention.

Figure 11:
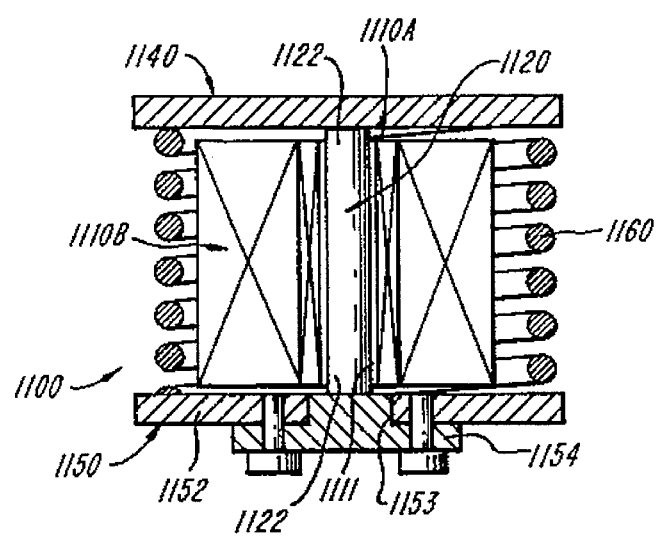

The actuator 1100 of FIG. 11 includes a magnetostrictive rod 1120 surrounded by an HTSC DC driver coil 1110A wound on a bobbin 1111, which is in turn surrounded by an HTSC AC bias coil 1110B. The opposite ends 1122 of rod 1120 abut a pair of end plates 1140, 1150.

In the illustrated embodiment, end plate 1150 includes two pieces, an outer annulus plate 1152 having a central hole 1153 of diameter slightly greater than that of rod 1122, and a center plate 1154 that abuts the outer surface of annulus plate 1152 and includes a central cylindrical projection that fits tightly into hole 1153. The two pieces of end plate 1150 are bolted together.

The plate 1140 at the other end of rod 1120 is arranged to oscillate in response to the actuation of coil 1110A.

A helical compression spring 1160 surrounds coils 1110A and 1110B, and the opposite ends of the spring are attached, e.g., welded, to the inner surfaces of plates 1140 and 1152. As discussed previously, it is important that the magnetostrictive rod always be held in compression, and the required compressive force is provided by spring 1160.

Providing separate AC and DC coils decreases the inductive power required from the power source (not shown) to which the coils are electrically connected. In operation, the AC bias coil 1110B maintains a steady field in the range of about 500 to about 1000 Gauss, and the AC driver coil 1110A provides the varying field required to cause oscillatory strain in rod 1120 and hence cause the resulting oscillation of plate 1140 to produce the desired acoustic signal. Typically, end plates 1140 and 1150 are made of high permeability material, thus maintaining the magnetic field within the structure and increasing the efficiency of the electrical-to-acoustic conversion.

FIG. 12 illustrates a somewhat modified actuator 1200 in which the DC bias field is provided by a permanent magnet 1210B rather than an electromagnetic coil, and in which a high permeability end cap 1260 is provided at the oscillatory end of the device. The magnetostrictive rod 1222 extends through a coaxial opening in end plate 1260 and abuts the oscillatory end plate 1240. As shown, end cap 1260, like the fixed plate 1252 at the other end of the actuator, contacts the ends of the magnet 1210B and is in close proximity to the ends of the AC HTSC coil 1210A. It thus will be seen that, unlike as shown in the actuator 1100 of FIG. 11, the distance from the magnets to the high permeability material at the oscillatory end of the device is constant and does not vary as the output plate 1240 oscillates.

Referring now to FIG. 13, there is shown an actuator 1300 in which a plurality of strips 1322 (or relatively small rods) of magnetostrictive material are spaced circumferentially around an HTSC DC coil 1310B and are themselves surrounded by an HTSC AC coil 1310A. A plurality of support rings 1360 are spaced axially along the length of actuator 1300 in such a position as to engage the inner surfaces of, and thus mechanically support and prevent buckling of, strips 1322.

A pair of iron plates 1340, 1350, at least one of which is free to oscillate in response to changes in strain of strips 1322, is provided at the opposite ends of the device, abutting the opposite ends of strips 1322 and in close proximity to the ends of coils 1310A and 1310B. Each plate 1340, 1350 includes a cylindrical projection, designated 1341, 1351 respectively, that extends from the inner surface of the plate coaxially into the circular bore of DC coil 1310B. As will be apparent, the DC coil creates a magnetic flux in the projections which the iron end plates direct to the TbDy magnetostrictive strips 1322.

In practice, the actuators of FIGS. 11 through 13 will, of course, be associated with a cooler (such as those previously described or discussed) to maintain the magnetostrictors and HTSC coils at temperatures in the desired ranges, e.g., about 4 to about 150 degrees Kelvin.

Other embodiments will be within the shape of the following claims.

What is claimed is:

1. An actuator including a magnetostrictor, and at least one coil of superconducting wire comprising a plurality of turns of HTSC wire arranged to produce a magnetic field and to subject said magnetostrictor to said field, said actuator being characterized by:

a substantially vacuum-tight enclosure surrounding said magnetostrictor and said coil;

a cooling system arranged to maintain said magnetostrictor at a temperature that is below the magnetic transition temperature of the magnetostrictor and to maintain said coil at a temperature that is below the superconducting critical temperature of said coil, said cooling system comprising a coldhead located partially within and extending to without said enclosure, a cooler without said enclosure thermally connected to said coldhead, a cyrogenic gas within said enclosure, said gas being in its vapor state at temperatures below said magnetic transition and superconducting critical temperatures, and a thermal conductor extending from said coil to said coldhead, whereby both said gas and said thermal conductor are arranged and adapted to conduct heat to said coldhead.

2. The actuator of claim 1 wherein said thermal conductor includes a plurality of conductors extending from within said coil to a point exterior of said coil but within said enclosure, and a further conductor extending from said plurality of conductors to said coldhead.

3. The actuator of claim 2 wherein said plurality of conductors are interposed between adjacent turns of HTSC wire of said coil.

4. The actuator of claim 1 further characterized in that said actuator includes a second vacuum enclosure surrounding said first-mentioned enclosure, a connector arranged to move in response to magnetically induced strain in said magnetostrictor, one end of said connector engaging the end of said magnetostrictor and the other end of said connector extending through a wall of said first-mentioned enclosure, a piston engaging said other end of said connector and extending into said second enclosure, and a flexible seal extending from said piston to said wall of said first mentioned enclosure and providing a seal around said other end of said conductor.

5. The actuator of claim 1 including a connector arranged to move in response to magnetically induced strain in said magnetostrictor, one end of said connector engaging an end of said magnetostrictor and the other end of said connector arranged to transmit motion thereof through said enclosure.

6. The actuator of claim 5 wherein said connector includes a piston at the said other end thereof, a flexible seal is provided between the piston and a fixed adjacent portion of said enclosure, and a sound absorbing material is provided on the inner side of said piston.

7. The actuator of claim 1 wherein said gas is selected from the group consisting of helium, nitrogen, hydrogen, neon, argon, oxygen and methane.

8. The actuator of claim 7 wherein said gas is neon.

9. The actuator of claim 1 wherein said gas is a gas that is in a vapor state at temperatures below 150° K.

10. The actuator of claim 1 wherein both said coil and magnetostrictor are maintained at temperatures below about 150° K.

11. The actuator of claim 1 wherein said cooler includes a cyrocooler, and said coil and magnetostrictor are maintained at temperatures not less than about 10° K.

12. The actuator of claim 1 wherein said cooler includes a liquid cyrogen.

13. The actuator of claim 1 wherein said coil and said magnetostrictor are maintained at temperatures in the range of about 4° K. to about 130° K.

14. An actuator including a magnetostrictor, and at least one coil of superconducting wire comprising a plurality of turns of HTSC wire arranged to produce a magnetic field and to subject said magnetostrictor to said field, said actuator being characterized by:

a substantially vacuum-tight enclosure surrounding said magnetostrictor and said coil;

a cooling system arranged to maintain said magnetostrictor at a temperature that is below the magnetic transition temperature of the magnetostrictor and to maintain said coil at a temperature that is below the superconducting critical temperature of said coil, said cooling system comprising a coldhead located partially within and extending to without said enclosure, a cooler without said enclosure thermally connected to said coldhead, a cyrogenic coolant within said enclosure, and a thermal conductor extending from said coil to said coldhead, whereby both said coolant and said thermal conductor are arranged and adapted to conduct heat to said coldhead.

15. An actuator including a magnetostrictor, and at least one coil of superconducting wire comprising a plurality of turns of HTSC wire arranged to produce a magnetic field and to subject said magnetostrictor to said field, said actuator being characterized by:

a cooling system arranged to maintain said magnetostrictor at a temperature that is below the magnetic transition temperature of the magnetostrictor and to maintain said coil at a temperature that is below the superconducting critical temperature of said coil;

a first, substantially vacuum-tight enclosure surrounding said magnetostrictor and said coil;

a second vacuum enclosure surrounding said first enclosure;

a connector arranged to move in response to magnetically induced strain in said magnetostrictor, one end of said connector engaging the end of said magnetostrictor and the other end of said connector extending through a wall of said first enclosure;

a piston engaging said other end of said connector and extending into said second enclosure; and a flexible seal extending from said piston to said wall of said first enclosure and providing a seal around said other end of said conductor.

16. The actuator of claim 15 including a sound absorbing material within said enclosure generally surrounding said piston.

17. The actuator of claim 15 wherein said second enclosure includes a flexible wall engaging the end of said piston most distant from said first enclosure.

* * * * *